United States Patent [19]

Iizuka

[11] Patent Number: 5,084,745
[45] Date of Patent: Jan. 28, 1992

[54] SEMICONDUCTOR MEMORY DEVICE HAVING A FLOATING GATE

[75] Inventor: Tetsuya Iizuka, Funabashi, Japan

[73] Assignee: Kabushiki Kaisha Toshiba, Kawasaki, Japan

[21] Appl. No.: 517,543

[22] Filed: Apr. 27, 1990

Related U.S. Application Data

[63] Continuation of Ser. No. 931,985, Nov. 24, 1986, abandoned, which is a continuation of Ser. No. 601,316, Apr. 17, 1984, abandoned.

[30] Foreign Application Priority Data

Apr. 18, 1983 [JP] Japan ................. 58-68080
Jul. 29, 1983 [JP] Japan ................ 58-138855

[51] Int. Cl.$^5$ .................. H01L 29/68; H01L 29/78; H01L 27/02
[52] U.S. Cl. .................. 357/23.5; 357/23.6; 357/51; 365/185
[58] Field of Search .......... 357/23.5, 23.6, 51, 357/41, 54; 365/185

[56] References Cited

U.S. PATENT DOCUMENTS

| | | |
|---|---|---|
| 3,919,711 | 11/1975 | Chou . |
| 4,004,159 | 1/1977 | Rai et al. ............... 357/23.5 |
| 4,087,795 | 5/1978 | Rossler ................. 357/23.5 |
| 4,099,196 | 7/1978 | Simko .................. 357/23.5 |
| 4,209,849 | 6/1980 | Schrenk ................ 357/23.5 |
| 4,297,719 | 10/1981 | Hsu . |
| 4,314,265 | 2/1982 | Simko .................. 357/23 |
| 4,399,523 | 8/1983 | Gerber et al. .......... 357/23.5 |
| 4,404,577 | 9/1983 | Cranford, Jr. et al. ... 357/41 |
| 4,417,264 | 11/1983 | Angle .................. 357/23.5 |
| 4,462,090 | 7/1984 | Iizuka ................. 357/23.5 |
| 4,503,519 | 3/1985 | Arakawa ............... 357/23.5 |
| 4,577,215 | 3/1986 | Stewart et al. ......... 357/23.5 |
| 4,616,340 | 10/1986 | Hayashi et al. ......... 357/23.5 |

FOREIGN PATENT DOCUMENTS

| | | |
|---|---|---|
| 81303190.3 | 2/1982 | European Pat. Off. . |
| 54-40043 | 3/1979 | Japan ................. 357/23.5 |
| 55-153375 | 11/1980 | Japan ................. 357/23.5 |
| 57-80779 | 5/1982 | Japan ................. 357/23.5 |
| 58-12367 | 1/1983 | Japan ................. 357/23.5 |
| 58-39067 | 3/1983 | Japan ................. 357/23.5 |
| 58-121678 | 7/1983 | Japan ................. 357/23.5 |
| 59-61062 | 4/1984 | Japan ................. 357/41 |
| 2077492A | 12/1981 | United Kingdom . |
| 2107519 | 4/1983 | United Kingdom ....... 357/23.5 |

OTHER PUBLICATIONS

A New Approach For The Floating-Gate MOS Nonvolatile Memory, Applied Physics Letters, vol. 31, No. 7, Oct. 1, 1977, by H. S. Lee.
Johnson et al., "A 16Kb Electrically Erasable Nonvolatile Memory," IEEE International Solid-State Circuits Conference, ISSCC, Feb. 14, 1980.
Yeargain et al., "A High Density Floating-Gate EPROM Cell," Technical Digest of Int. Electron Devices Meeting, p. 24, 1981.

Primary Examiner—Andrew J. James
Assistant Examiner—Ngan Van Ngo
Attorney, Agent, or Firm—Finnegan, Henderson, Farabow, Garrett and Dunner

[57] ABSTRACT

A semiconductor memory device includes first and second n+-type regions formed in the surface area of a p-type substrate; a floating gate insulatively formed over a channel region between the first and second n+-type regions; and a control gate disposed to face the floating gate. The area of the portion of the control gate which faces the floating gate is set to be smaller than the effective area of the portion of the floating gate which faces an active region including the first and second n+-type regions and channel region.

1 Claim, 5 Drawing Sheets

SEMICONDUCTOR MEMORY DEVICE HAVING A FLOATING GATE

This application is a continuation of application Ser. No. 06/931,985, filed Nov. 24, 1986, now abandoned, which is a continuation of application Ser. No. 06/601,316, filed Apr. 17, 1984, now abandoned.

BACKGROUND OF THE INVENTION

The present invention relates to an electrically rewritable semiconductor memory device.

Figure 1:
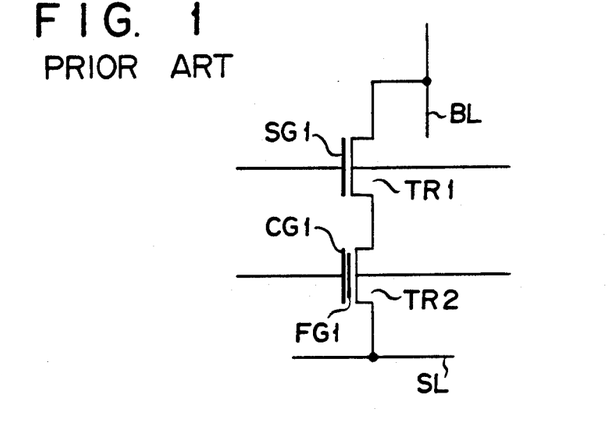
FIG. 1 is a circuit diagram showing a conventional semiconductor memory device having a floating gate.

Conventionally, there is known an electrically erasable and programmable read only memory (EEPROM) which can be formed with relatively high density. The description with respect to a memory cell constituting this EEPROM is shown in, for example, "IEEE Journal of Solid-State Circuits", Vol. SC-17, No. 5, pp. 821–827, (1982). FIG. 1 shows an example of a memory cell of this kind. This memory cell comprises a selection MOS transistor TR1 whose drain is connected to a bit line BL, and a floating gate MOS transistor TR2, which has a floating gate FG1, and whose drain and source are respectively connected to a source of the MOS transistor TR1 and a source line SL. A selection gate SG1 of the MOS transistor TR1 is connected to a word life (not shown), while a control gate CG1 of the MOS transistor TR2 is connected to an external control circuit (not shown).

Figure 2:
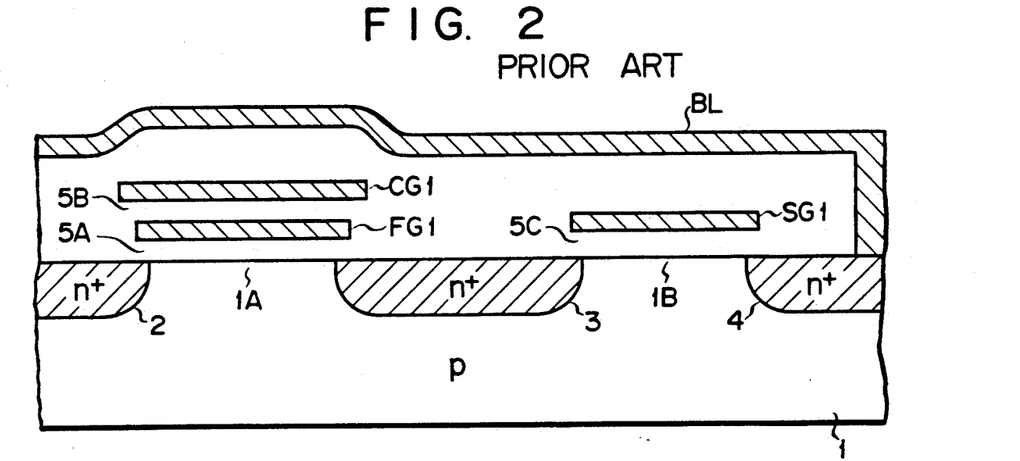
FIG. 2 illustrates a cross sectional structure of a semiconductor memory device to realize the circuit shown in FIG. 1.

FIG. 2 schematically illustrates a cross sectional structure of a semiconductor memory device having the MOS transistors TR1 and TR2. This semiconductor memory device includes a p-type substrate 1, $n^+$-type regions 2 to 4 formed in the surface area of this p-type substrate 1, the floating gate FG1 formed through an insulating layer 5A over a local region 1A of the substrate 1 between the $n^+$-type regions 2 and 3, the control gate CG1 formed through an insulating layer 5B over the floating gate FG1, and the selection gate SG1 formed through an insulating layer 5C over a local region 1B of the substrate 1 between the $n^+$-type regions 3 and 4. The control gate CG1, floating gate FG1, and $n^+$-type regions 2 and 3 constitute the MOS transistor TR2, while the selection gate SG1 and $n^+$-type regions 3 and 4 constitute the MOS transistor TR1. The bit line BL is coupled to the $n^+$-type region 4 serving as the drain of the MOS transistor TR1 and is formed to extend over the gates CG1 and SG1. The capacitance between the gates CG1 and FG1 is set to C1; the capacitance between the floating gate FG1 and the $n^+$-type region 2 is set to C2; the capacitance between the floating gate FG1 and the local region 1A of the substrate 1 is set to C3; and the capacitance between the floating gate FG1 and the $n^+$-type region 3 is set to C4. In this case, this semiconductor memory device is formed so as to meet the following condition.

$$C1 > C2 + C3 + C4 \qquad (1)$$

The operation of the semiconductor memory device shown in FIGS. 1 and 2 will now be described. The erasing operation is executed by applying a high voltage VP of, e.g., 16 to 21 V to the selection gate SG1 and control gate CG1 and by setting the bit line BL and source line SL to 0 V. In this case, the MOS transistor TR1 is made conductive, the source and drain regions 2 and 3 of the MOS transistor TR2 are held to 0 V, the voltage VP is applied to the control gate CG1, and also C1 > C2 + C3 + C4; therefore, a higher voltage than the voltage between the floating gate FG1 and the control gate CG1 is applied between the floating gate FG1 and the $n^+$-type regions 2 and 3. Since the insulating layer 5A is formed extremely thin to about 100 Å, a current called a Fowler Nordheim current flows from the floating gate FG1 to the $n^+$-type regions 2 and 3, so that electrons are trapped in the floating gate FG1.

The writing operation is executed by applying the voltage VP to the selection gate SG1; the voltage 0 V to the control gate CG1; the voltage VP to the bit line BL; and the voltage of 5 V to the source line SL. In addition, in this case, instead of applying the voltage of 5 V to the source line SL, it may be also held in the floating state. Even in this case, a high voltage is applied between the floating gate FG1 and the $n^+$-type regions 2 and 3, so that the electrons stored in this floating gate FG1 are drained through the drain region or $n^+$-type region 3, causing the quantity of electrons in this floating gate FG1 to be reduced. Therefore, the threshold voltage of the MOS transistor TR2 decreases and has a threshold value of, e.g., $-5$ V. Namely, this MOS transistor TR2 operates as the depletion type MOS transistor. The reason why the voltage of 5 V was applied to the source line SL or it was held in the floating state is to interrupt the unwanted current flowing from the drain region of the MOS transistor TR2 to the source region.

In the semiconductor memory device shown in FIG. 2, since the source line SL is held to the potential of 5 V or in the floating state upon writing, a voltage is applied between this source line SL and the floating gates of the non-selected memory cells coupled to this source line SL, lowering the charge holding property of these non-selected memory cells. Namely, the electrons in this floating gate flow out gradually due to the voltage applied between the source region of the non-selected memory cell and the floating gate, thereby causing the memory data to be changed.

Figure 3:
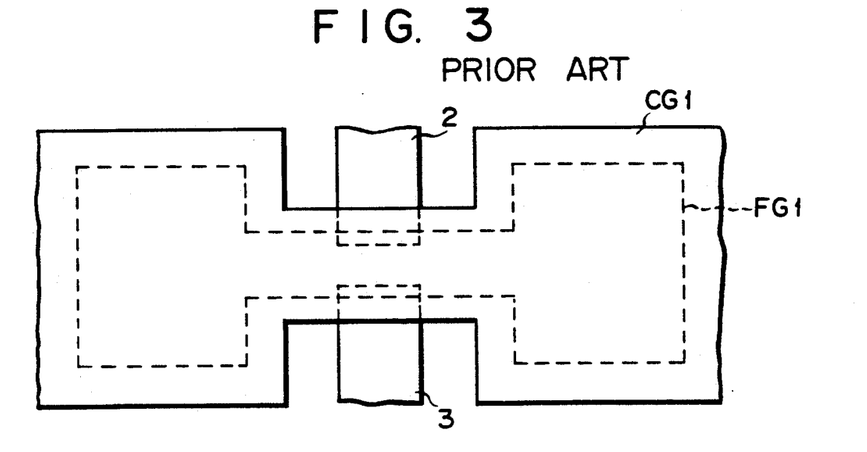
FIG. 3 shows the positional relationship between the floating gate and the control gate shown in FIG. 2.

In addition, in the semiconductor memory device shown in FIG. 2, the thin insulating layer 5A having a thickness of 100 to 200 Å can be formed by thermally oxidizing the monocrystalline silicon or substrate 1; however, since the insulating layer 5B is the oxide film of polycrystalline silicon, a thin layer cannot be formed, so it is formed to have the thickness of, e.g., 800 Å. Consequently, to meet the condition (1), for example, as shown in FIG. 3, it is required to enlarge that portion of the floating gate FG1 which faces the control gate CG1 so as to increase the capacitance C1 between the floating gate FG1 and control gate CG1. Therefore, a large occupying area is necessary to form the floating gate FG1 and control gate CG1, causing difficulty in realizing higher integration.

SUMMARY OF THE INVENTION

It is an object of the present invention to provide a semiconductor memory device which can improve the data holding property and can be integrated with high density.

This object is accomplished by providing a semiconductor memory device comprising a semiconductor substrate of one conductivity type; first and second semiconductor regions of the opposite conductivity type formed in the surface area of this semiconductor substrate; a floating gate insulatively formed over a channel region between these first and second semiconductor regions; and a control gate disposed to face this floating gate and formed to make that portion of this control gate which faces the above floating gate have a smaller area than that portion of this floating gate which faces the active region including the above first and second semiconductor regions and channel region.

In the present invention, the opposing area between the control gate and the floating gate is reduced, and when the erase voltage or write voltage is applied between the control gate and the first and second semiconductor regions, a strong electric field is produced between the control gate and the floating gate, thereby executing the erasing or writing operation. Due to this, the control gate with a small area can be formed, and at the same time, this allows the Fowler Nordheim current to flow between the control gate and the floating gate; therefore, the erasing and writing operations are securely executed.

DETAILED DESCRIPTION OF THE PREFERRED EMBODIMENTS

Figure 4:
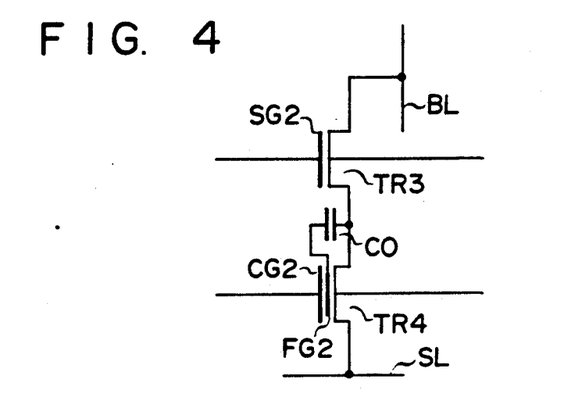
FIG. 4 shows an equivalent circuit of a semiconductor memory device according to one embodiment of the present invention.
Figure 5:
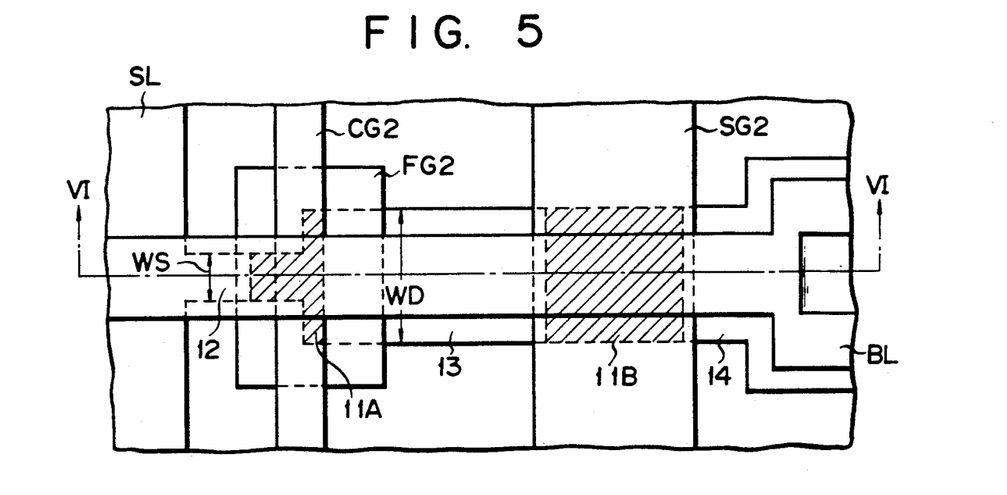
FIG. 5 schematically illustrates a top plan pattern of this semiconductor memory device.
Figure 6:
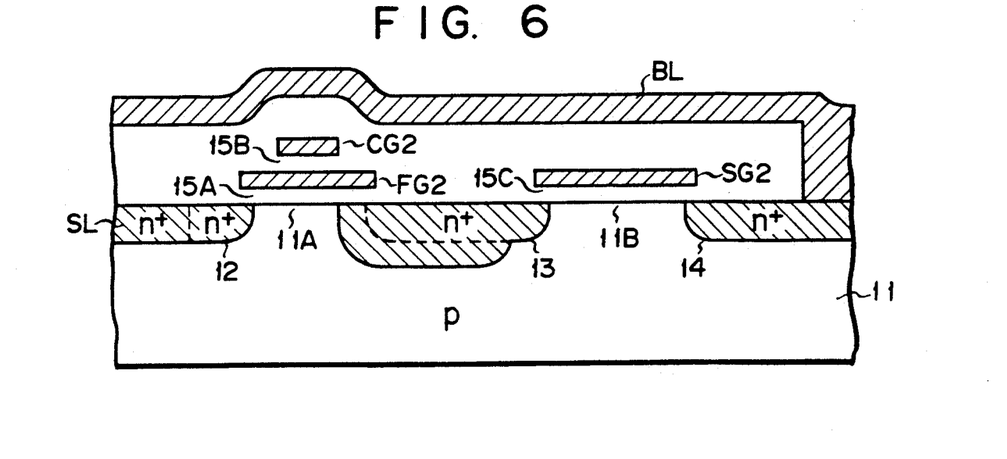
FIG. 6 illustrates a cross sectional structure taken along the line VI—VI of the semiconductor memory device shown in FIG. 5.

FIG. 4 shows an equivalent circuit of a semiconductor memory device according to one embodiment of the present invention. FIGS. 5 and 6 illustrate a top plan pattern and a cross sectional structure of this semiconductor memory device. The circuit shown in FIG. 4 includes a selection MOS transistor TR3 whose drain is coupled to the bit line BL; a floating gate MOS transistor TR4, which has the floating gate FG2, and whose drain and source are respectively connected to a source of the MOS transistor TR3 and to the source line SL; and a capacitor CO coupled between the floating gate FG2 and the drain of the MOS transistor TR4

The semiconductor memory device shown in FIGS. 5 and 6 includes $n^+$-type regions 12 to 14 formed in the surface area of a p-type substrate 11; the floating gate FG2 formed through an insulating layer 15A over a local region or channel region 11A of the substrate 11 between the $n^+$-type regions 12 and 13; the control gate CG2 formed through an insulating layer 15B over this floating gate FG2; and a selection gate SG2 formed through an insulating layer 15C over a channel region 11B of the substrate 11 between the $n^+$-type regions 13 and 14. In addition, the channel regions 11A and 11B in FIG. 5 are hatched.

The capacitance between the gates CG2 and FG2 is set at C5; the capacitance between the floating gate FG2 and the $n^+$-type region 12 is set at C6; the capacitance between the floating gate FG2 and the channel region 11A is set at C7; and the capacitance between the floating gate FG2 and the $n^+$-type region 13 is set at C8. This semiconductor memory device is formed so as to meet the following conditions.

$$C5 < C8 \tag{2}$$

$$C8 > C6 + C7 \tag{3}$$

To satisfy these conditions, in this embodiment, the capacitance C8 between the floating gate FG2 and the $n^+$-type region 13 is set at a large value. This capacitance C8 corresponds to the capacitor CO in FIG. 4. As clearly shown in FIG. 5, the source region 12 and drain region 13 are formed so that a width WD of the drain region 13 is larger than a width WS of the source region 12. Due to this, the capacitance C8 is set at a substantially larger value than the capacitance C6. On the other hand, as clearly illustrated in FIG. 6, the $n^+$-type region 13, serving as the drain of the MOS transistor TR4, is deeply formed so as to extend into an area under the floating gate FG2, thereby increasing the capacitance C8. In this way, in case of deeply forming the $n^+$-type region 13, impurities are implanted into the substrate 11 by way of the ion implantation method using the floating gate FG2 as a part of the mask. This enables the effective length of the channel region 11A of this MOS transistor TR4 to be accurately set by means of the self-alignment technology.

In addition, the control gate CG2 having a narrow width is formed to set the capacitance C5 to be small. On the other hand, the area of the portion of the control gate CG2 facing the floating gate FG2 is set to be smaller than that of the $n^+$-type region 13 facing the floating gate FG2.

In the semiconductor memory device shown in FIGS. 5 and 6, the erasing operation is executed by applying the high voltage VP to the selection gate SG2 and the control gate CG2 and by setting the bit line BL and source line SL to 0 V. Since the opposing area of the gates CG2 and FG2 is small and C5 < C6 + C8, a stronger electric field, in this case, than that between the floating gate FG2 and the $n^+$-type regions 12 and 13 is produced between the control gate CG2 and the floating gate FG2. Therefore, the Fowler Nordheim current flows from the control gate CG2 to the floating gate FG2, so that the electrons are drained from the floating gate FG2 to the control gate CG2. Due to this, the threshold value of this MOS transistor TR4 becomes negative, and it operates as a depletion type MOS transistor. Also in this case, since both n+-type regions 12 and 13 are set to 0 V, an unwanted current will not flow between these n+-type regions 12 and 13.

On the other hand, the writing operation is executed by applying the high voltage VP to the selection gate SG2, setting the control gate CG2 to 0 V, applying 5 V to the source line SL, and applying the high voltage VP to the bit line BL. In this case, the voltage (VP−VT1) obtained by subtracting the threshold voltage VT1 of the MOS transistor TR3 from the voltage VP is applied to the n+-type region 13. As mentioned before, in order to meet C5<C8, the opposing area of the floating gate FG2 and the n+-type region 13 is set to be larger than that of the gates CG2 and FG2, so that a strong electric field is produced between the floating gate FG2 and the control gate CG2, causing electrons to flow from the control gate CG2 into the floating gate FG2.

In addition, although the n+-type region 12 is set at 5 V, since the capacitance C6 is set to be smaller than the capacitance C8, the Fowler Nordheim current hardly flows from this n+-type region 12 to the floating gate FG2. As a result, even in the non-selected memory cells, the Fowler Nordheim current does not flow between the floating gate and the source region and no memory data will be lost. Also, the capacitance C5 may be set to a small value; therefore, it is possible to form the control gate CG2 in a small area, thereby enabling the degree of integration to be improved.

Figure 7:
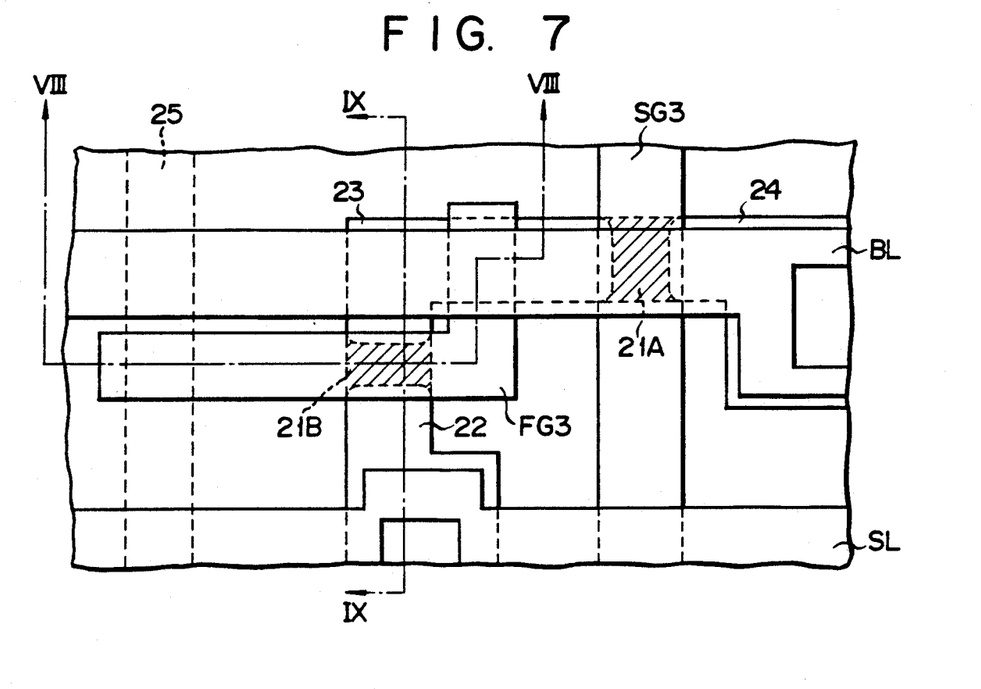
FIG. 7 schematically illustrates a top plan pattern of a semiconductor memory device according to another embodiment of the present invention.
Figure 8:
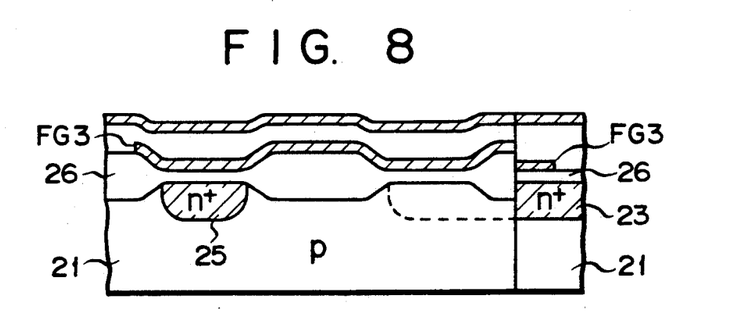
FIGS. 8 and 9 illustrate cross sectional structures taken along the lines VIII—VIII and IX—IX of the semiconductor memory device shown in FIG. 7, respectively.
Figure 9:
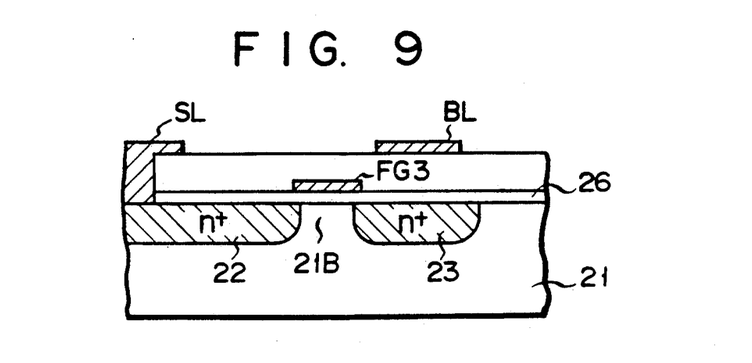

FIGS. 7 to 9 illustrate a semiconductor memory device according to another embodiment of the present invention. This semiconductor memory device includes a p-type substrate 21; an n+-type region 22 serving as the source of the MOS transistor TR4; an n+-type region 23 serving as the drain of the MOS transistor TR4 and the source of the MOS transistor TR3; an n+-type region 24 serving as the drain of the MOS transistor TR3; and an n+-type region 25 serving as the control gate of the MOS transistor TR4. A selection gate SG3 of the MOS transistor TR3 is formed through an insulating layer 26 over a channel region 21A between the n+-type regions 23 and 24. In addition, a floating gate FG3 of the MOS transistor TR4 is formed of, e.g., polysilicon and is formed through the insulating layer 26 over a channel region 21B between the n+-type regions 22 and 23. At the same time, the floating gate FG3 is formed through the insulating layer 26 over the n+type regions 23 and 25 so as to capacitively couple with these regions 23 and 25.

As clearly illustrated in FIGS. 8 and 9, the thin insulating layer 26 having substantially the constant thickness is formed between the floating gate FG3 and the n+-type region 25; between the floating gate FG3 and the channel region 21B; between the floating gate FG3 and the n+-type region 23; and between the selection gate SG3 (not shown) and the channel region 21A (not shown). On one hand, the capacitor formed between the floating gate FG3 and the n+-type region 23 corresponds to the capacitor CO in FIG. 4 and is formed so as to have a larger capacitance than the sum of capacitances between the floating gate FG3 and the channel region 21B and n+-type region 22. Also, the capacitance between the floating gate FG3 and the n+-type region 25 is set to a smaller value than the capacitance between the floating gate FG3 and the n+-type region 23. Namely, the opposing area of the floating gate FG3 and the n+-type region 23 is set to be larger than that of the floating gate FG3 and the n+-type region 25.

In addition, in this embodiment, the source line SL is formed to extend in parallel to the bit line BL, and at the same time, it is formed of an aluminum layer electrically coupled with the source region 22.

The erasing and writing operations in this semiconductor memory device are executed substantially in the same manner as in the case of the semiconductor memory device shown in FIGS. 5 and 6.

In such a semiconductor memory device, it is possible to form all the capacitors associated with the floating gate FG3 using an oxide film formed on the surface of the monocrystalline semiconductor substrate 21. That is, it is unnecessary to use a thick insulating layer 15B having the unstable insulation property shown in FIG. 6 to form the capacitor between the floating gate FG2 and the control gate CG2. Therefore, it is possible to easily and accurately set the capacitances of all the capacitors associated with the floating gate FG3. Furthermore, since the control gate is formed of the n+-type region 25 instead of being formed over the floating gate FG3, the manufacturing process is simplified.

Figure 10:
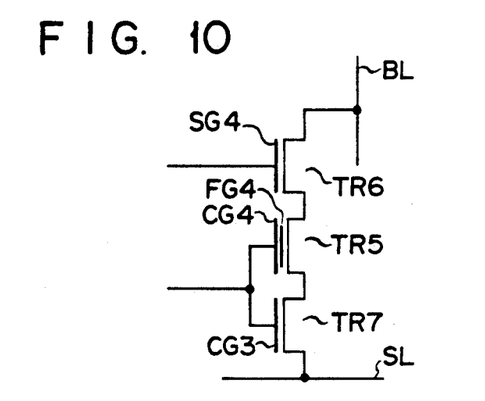
FIG. 10 shows an equivalent circuit of a semiconductor memory device according to still another embodiment of the present invention.
Figure 11:
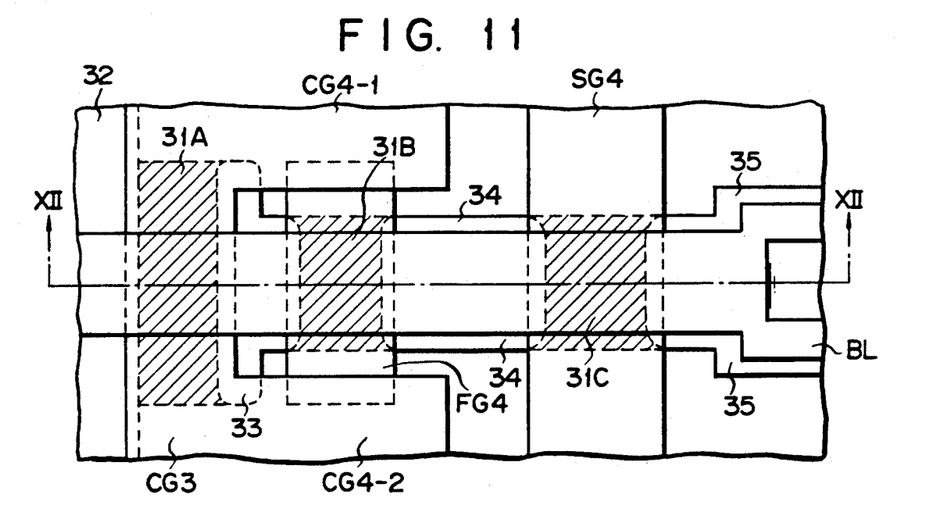
FIG. 11 schematically illustrates a top plan pattern of this semiconductor memory device.
Figure 12:
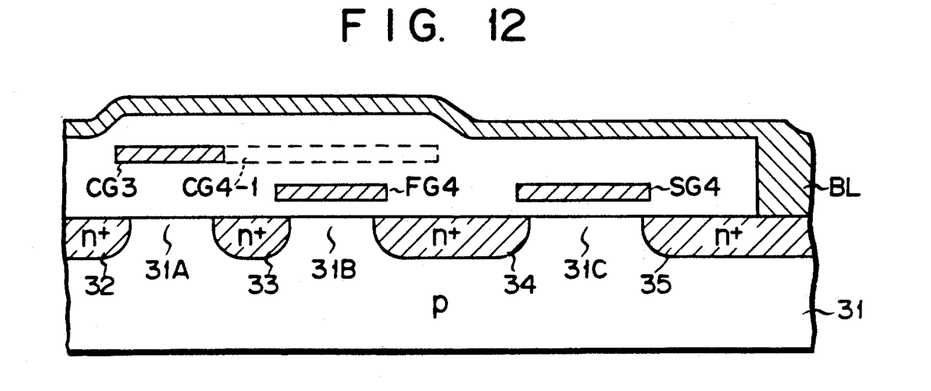
FIG. 12 illustrates a cross sectional structure taken along the line XII—XII of the semiconductor memory device shown in FIG. 11.

FIG. 10 shows an equivalent circuit of a semiconductor memory device according to still another embodiment of the present invention. FIGS. 11 and 12 respectively illustrate a top plan pattern and a cross sectional structure of this semiconductor memory device. The circuit shown in FIG. 10 is provided with a floating gate MOS transistor TR5 whose drain is connected to the bit line BL through a selection MOS transistor TR6 and whose source is connected to the source line SL through an isolation MOS transistor TR7. A control gate CG3 of the MOS transistor TR7 is coupled to a control gate CG4 of the MOS transistor TR5.

The semiconductor memory device shown in FIGS. 11 and 12 includes n+-type regions 32 to 35 formed in the surface area of a p-type substrate 31; the control gate CG3 formed through an insulating layer over a channel region 31A between the n+-type regions 32 and 33; the floating gate FG4 formed through the insulating layer over a channel region 31B between the n+-type region 33 and 34; and a selection gate SG4 formed through the insulating layer over a channel region 31C between the n+-type regions 34 and 35. The control gate CG4 of the MOS transistor TR5 is formed integrally with the control gate CG3 of the MOS transistor TR7 and has two control gate sections CG4-1 and CG4-2 arranged to extend in parallel to each other. The MOS transistor TR5 is formed of the gate sections CG4-1 and CG4-2, floating gate FG4, and n+-type regions 33 and 34. The MOS transistor TR6 is formed of the selection gate SG4 and n+-type regions 34 and 35. The MOS transistor TR7 is formed of the control gate CG3 and the n+-type regions 32 and 33.

In this embodiment, the sum of capacitances between the floating gate FG4 and the control gate sections CG4-1 and CG4-2 is held to be substantially constant even if the relative positional relationships between this floating gate FG4 and the control gate sections CG4-1 and CG4-2 vary slightly. In addition, since the n+-type regions 33 and 34 are formed using the floating gate FG4 as part of mask, it is possible to set the opposing area of the floating gate FG4 and the n+-type regions 33 and 34 with a relatively high degree of accuracy. Therefore, it is possible to accurately set the ratio of the sum of capacitances between the floating gate FG4 and the control gate sections CG4-1 and CG4-2 to the capacitance between the floating gate FG4 and an active region including the n+-type regions 33 and 34 and the channel region 31B. In this embodiment, the total area of portions of the floating gate FG4 which face the control gate sections CG4-1 and CG-2 is set to a smaller value than the area of portion of this floating gate FG4 which faces the active region including the n+-type regions 33 and 34 and channel region 31B.

In this embodiment, the erasing operation is executed by applying a voltage of 5 V to VP to the selection gate SG4 to make the MOS transistor TR6 conductive; applying the voltage VP to the control gate CG4; and setting the bit line BL and source line SL to 0 V. Due to this, in the similar manner as described before, a strong electric field is produced between the floating gate FG4 and the control gates CG4-1 and CG4-2 for allowing the Fowler Nordheim current to flow from the control gate sections CG4-1 and CG4-2 to the floating gate FG4, i.e., the electrons are drained from the floating gate FG4 to the control gate sections CG4-1 and CG4-2, thereby reducing the threshold voltage of this MOS transistor TR5 to, for example, −5 V. Namely, this MOS transistor TR5 serves as the depletion type MOS transistor. In addition, in this case, since both drain and source of the MOS transistor TR7 are set to 0 V, an unwanted current will not flow through the channel 31A.

On the other hand, the writing operation in this semiconductor memory device is executed by applying the voltage VP to the selection gate SG4; setting the control gate CG3 and control gate sections CG4-1 and CG4-2 to 0 V; and applying the voltage VP to the bit line BL. In this case, the voltage (VP−VT2) obtained by subtracting the threshold voltage VT2 of the MOS transistor TR6 from the voltage VP is applied to the drain of the MOS transistor TR5, i.e., to the n+-type region 34. Since the erasing operation has been executed before executing the writing operation, the threshold voltage of the MOS transistor TR5 is set to a negative level, e.g., −5 V. Thus, an inversion layer is formed in the channel region 31B, thereby holding the n+-type regions 33 and 34 to the same potential. Therefore, the floating gate FG4 is set to a high potential, and the strong electric field is produced between the floating gate FG4 and the control gate sections CG4-1 and CG4-2, so that the electrons flow from these control gate sections CG4-1 and CG4-2 into the floating gate FG4. Thus, the threshold voltage of the MOS transistor TR5 is shifted in the positive direction, thereby making this MOS transistor operative as the enhancement type MOS transistor. In this case, if the MOS transistor TR7 is of the enhancement type, since the control gate CG3 and source line SL are held to 0 V, this MOS transistor TR7 will be held in the nonconducting state. However, in this case, to render this MOS transistor TR7 conductive in the readout mode, it is required to set the potential of the control gate CG3 at 1 to 3 V. To hold this MOS transistor TR7 in the conducting state in the readout mode while the voltage of 0 V is being applied to the control gate CG3, it is necessary to change this MOS transistor TR7 to the depletion type. Also in this case, the potential of the source line SL may be set to a larger value than the absolute value of the threshold voltage of the isolation MOS transistor TR7 in the write mode.

In this embodiment, since both end portions of the floating gate FG4 are disposed to overlap the end portions of the control gate sections CG4-1 and CG4-2, the electric fields are concentrated between the end portions of the floating gate FG4 and the respective end portions of the control gate sections CG4-1 and CG4-2. Due to this, the erasing and writing operations can be easily executed. In addition, since the isolation MOS transistor TR7 is used, even when the channel length of the MOS transistor TR5 is set to be short, it is possible to securely prevent the occurrence of the punch through phenomenon between the source and drain of the MOS transistor TR5 in the write mode.

Figure 13:
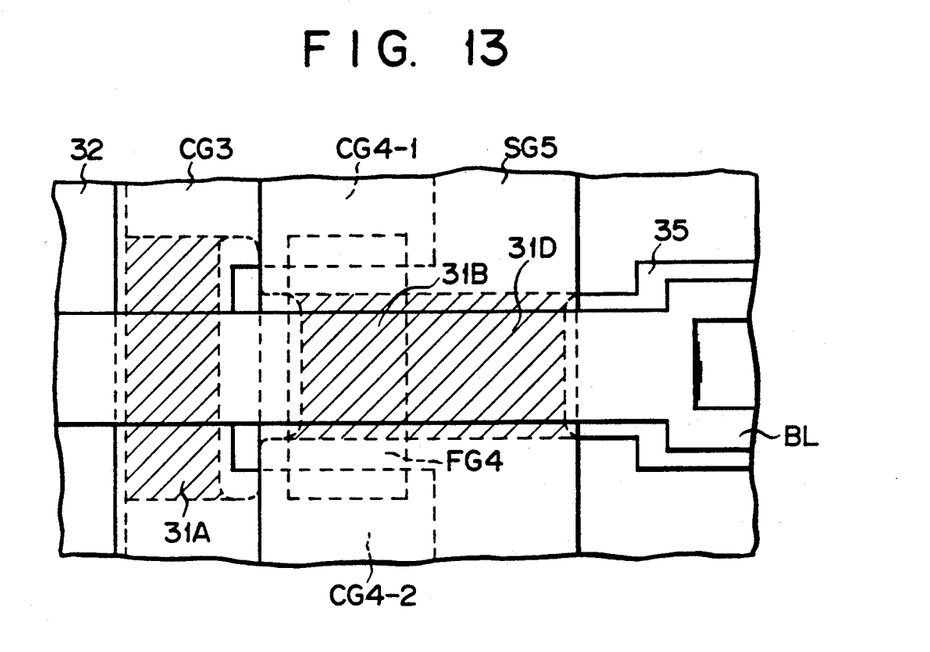
FIG. 13 illustrates a schematic top plan pattern of a semiconductor memory device according to another embodiment of the present invention.
Figure 14:
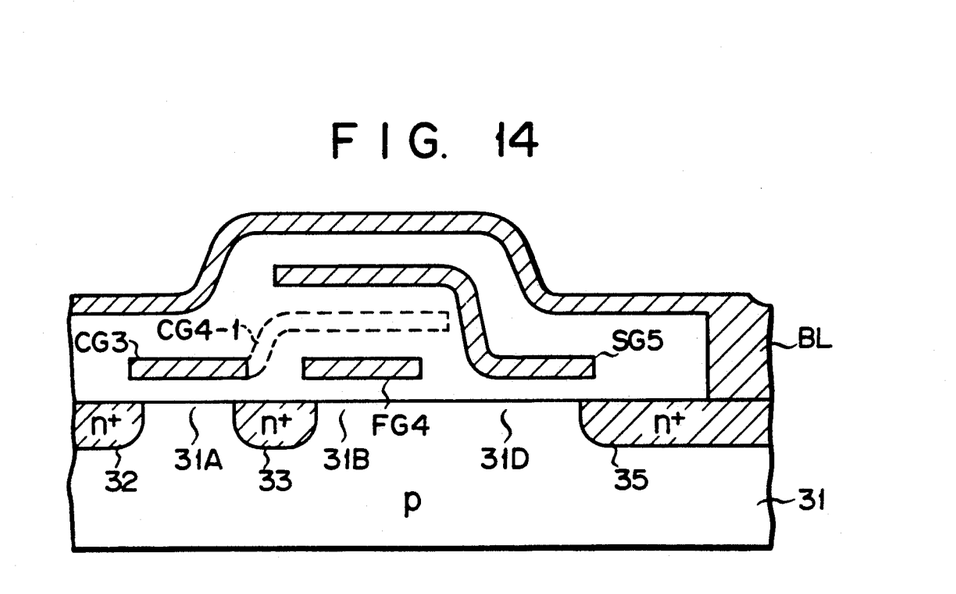
FIG. 14 illustrates a cross sectional structure taken along the line XIV—XIV of the semiconductor memory device shown in FIG. 13.

FIGS. 13 and 14 respectively illustrate a top plan pattern and a cross sectional structure of a semiconductor memory device according to still another embodiment of the present invention. This semiconductor memory device is constituted substantially in a manner similar to the device shown in FIGS. 11 and 12 with the exception that the n+-type region 34 is removed and that a selection gate SG5 is formed in place of the selection gate SG4. This selection gate SG5 has a first portion formed between the n+-type region 35 and the floating gate FG4, and a second portion formed insulatively over the control gate sections CG4-1 and CG4-2 and floating gate FG4. Due to this, for example, in the case of applying the voltage VP to the selection gate SG5, a channel region 31D is formed between the portion of the substrate 31 under the floating gate FG4 and the n+-type region 35. This channel region 31D performs the same function as the channel region 31C and n+-type region 34 in FIGS. 11 and 12. In this way, in this embodiment, since the n+-type region 34 can be removed, the degree of integration can be enhanced.

Although the present invention has been described above with respect to embodiments, the present invention is not limited to only these embodiments. For instance, although the voltage (VP−VT2) is applied to the n+-type region 34 in the write mode in the embodiment shown in FIGS. 10 to 12, in this case, there may be a case where the inversion layer in the channel region 31B will have disappeared due to the substrate bias effect. Once this inversion layer has disappeared, the writing operation cannot be preferably executed. To solve such a problem, it is possible to form the n+-type region 34 in the similar manner as the n+-type region 13 shown in FIG. 6 and to make the area of portion of the floating gate FG4 facing the n+-type region 34 larger than the sum of areas of portions of the floating gate FG4 facing the control gate sections CG4-1 and CG4-2.

What is claimed is:

1. A semiconductor memory device, comprising:
a semiconductor substrate of one conductivity type;
first, second and third semiconductor regions of an opposite conductivity type formed in a surface area of said semiconductor substrtate, a first channel region formed between said first and second semiconductor regions and a second channel region formed between said second and third semiconductor regions;
a first insulating layer formed on said surface area of said semiconductor substrate above said first and second channel regions;
a floating gate formed on said first insulating layer and having a first predetermined area adjacent to and spaced from said second semiconductor region to form a fist capacitance between said floating gate and said second semiconductor region;
a first control gate region formed in the surface are of said semiconductor substrate under said floating gate, said first insulating layer being interposed between said first control gate and said floating gate to form a second capacitance between said floating gate and said first control gate region, the first control gate region having a second predetermined area adjacent to and spaced from said floating gate, wherein said second predetermined area is smaller than said first predetermined area such that said second capacitance is smaller than said first capacitance;

a source line connected to said first semiconductor region;

a selection gate formed on said first insulation layer above said second channel region;

a bit line connected to said third semiconductor region and formed over said first control gate region and said selection gate; and potential setting means for setting, in a date erasing operation, a first potential to said selection gate and said first control gate region and a second potential lower than said first potential to said source line and said bit line to form an electric field between said first control gate region and said floating gate greater than an electric field between said floating gate and said second semiconductor region to remove electrons held in said floating ate to said first control gate region, and for setting, in a data writing operation, a third potential to said selection gate and said bit line and a fourth potential lower than said third potential to said first control gate region and said source line to form an electric field between said first control gate region and said floating gate greater than an electric field between said floating gate and said second semiconductor region to inject electrons into said floating gate from said first control gate region.

* * * * *